US010495692B2

(12) United States Patent
Miura et al.

(10) Patent No.: US 10,495,692 B2
(45) Date of Patent: Dec. 3, 2019

(54) BATTERY MONITOR

(71) Applicant: Hitachi Automotive Systems, Ltd., Hitachinaka-shi, Ibaraki (JP)

(72) Inventors: Hikaru Miura, Hitachinaka (JP); Mutsumi Kikuchi, Hitachinaka (JP); Akihiko Kudoh, Hitachinaka (JP); Tomonori Kanai, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 14 days.

(21) Appl. No.: 15/753,057

(22) PCT Filed: Aug. 8, 2016

(86) PCT No.: PCT/JP2016/073224
§ 371 (c)(1),
(2) Date: Feb. 15, 2018

(87) PCT Pub. No.: WO2017/043238
PCT Pub. Date: Mar. 16, 2017

(65) Prior Publication Data
US 2018/0246169 A1   Aug. 30, 2018

(30) Foreign Application Priority Data

Sep. 11, 2015 (JP) ................................. 2015-179360

(51) Int. Cl.
*G01R 31/327* (2006.01)
*G01R 31/378* (2019.01)
(Continued)

(52) U.S. Cl.
CPC ........ *G01R 31/3278* (2013.01); *B60L 3/0046* (2013.01); *G01R 31/378* (2019.01);
(Continued)

(58) Field of Classification Search
CPC .. G01R 31/007; G01R 31/378; G01R 31/396; G01R 31/3278; B60L 3/00; B60L 3/0046
(Continued)

(56) References Cited

U.S. PATENT DOCUMENTS 5,880,575 A * 3/1999 Itou ..................... H01M 10/441
                                                                    320/122
2007/0090798 A1* 4/2007 Yun ....................... B60L 3/0038
                                                                    320/116
(Continued)

FOREIGN PATENT DOCUMENTS

EP    2 308 714 A2    4/2011
JP    2008-92656 A    4/2008
(Continued)

OTHER PUBLICATIONS

Machine translation of JP2013219955 (Year: 2013).*
(Continued)

*Primary Examiner* — Christopher P McAndrew
(74) *Attorney, Agent, or Firm* — Crowell & Moring LLP (57) ABSTRACT

The present invention enables correct detection of the state of a relay provided on each of the positive and negative terminal sides of a secondary battery. A positive-side main relay makes or breaks continuity between first and second positive contact points, and a negative-side main relay makes or breaks continuity between first and second negative contact points. A microcomputer can measure a first voltage between the first positive and first negative contact points, a second voltage between the second positive and first negative contact points, and a third voltage between the first positive and second negative contact points. The microcomputer detects the state of the positive-side main relay based on a voltage measurement result obtained when the first and second voltages are measured synchronously, and detects the state of the negative-side main relay based on a
(Continued)

voltage measurement result obtained when the first and third voltages are measured synchronously.

3 Claims, 7 Drawing Sheets

(51) Int. Cl.
*G01R 31/396* (2019.01)
*H01M 10/42* (2006.01)
*H02H 7/00* (2006.01)
*H02H 7/18* (2006.01)
*H02J 7/00* (2006.01)
*B60L 3/00* (2019.01)
*H01M 10/48* (2006.01)
*H02H 1/00* (2006.01)
*G01R 31/00* (2006.01)

(52) U.S. Cl.
CPC .......... *G01R 31/396* (2019.01); *H01M 10/42* (2013.01); *H01M 10/425* (2013.01); *H01M 10/48* (2013.01); *H02H 1/0007* (2013.01); *H02H 7/00* (2013.01); *H02H 7/18* (2013.01); *H02J 7/00* (2013.01); *B60L 3/00* (2013.01); *G01R 31/007* (2013.01); *H01M 2010/4271* (2013.01); *H02J 7/0026* (2013.01)

(58) Field of Classification Search
USPC ........................................................ 324/434
See application file for complete search history.

(56) References Cited

U.S. PATENT DOCUMENTS

| | | |
|---|---|---|
| 2007/0139005 A1 | 6/2007 | Osawa |
| 2009/0087722 A1* | 4/2009 | Sakabe ................ B60L 3/0046 |
| | | 429/61 |
| 2011/0234199 A1* | 9/2011 | Baert .................. B61L 15/0036 |
| | | 324/72 |
| 2014/0042828 A1 | 2/2014 | Itagaki et al. |
| 2015/0115972 A1 | 4/2015 | Park |

FOREIGN PATENT DOCUMENTS

| | | | |
|---|---|---|---|
| JP | 2011-166950 A | | 8/2011 |
| JP | 2013-219955 A | | 10/2013 |
| JP | 2013219955 A | * | 10/2013 |
| JP | 2014-54164 A | | 3/2014 |

OTHER PUBLICATIONS

International Search Report (PCT/ISA/210) issued in PCT Application No. PCT/JP2016/073224 dated Nov. 8, 2016 with English-language translation (Five (5) pages).
Japanese-language Written Opinion (PCT/ISA/237) issued in PCT/JP2016/073224 dated Nov. 8, 2016 (Four (4) pages).
Extended European Search Report issued in counterpart European Application No. 16844102.0 dated Mar. 21, 2019 (eight (8) pages).

* cited by examiner

BATTERY MONITOR

TECHNICAL FIELD

The present invention relates to a battery monitor.

BACKGROUND ART

Until now, a battery system which includes a rechargeable secondary battery and supplies electric power to a device mounted on a vehicle or the like has been known. In such a battery system, relays (contactors, electric relays) are provided on each of a positive terminal side and a negative terminal side of the secondary battery in order to switch the conduction states between the secondary battery and the device.

PTL 1 discloses a power supply device for detecting melting of a contactor provided on each of the positive terminal side and the negative terminal side of a battery for vehicle traveling. This power supply device has a simple voltage detection circuit that measures voltage on each of the battery side and the output side when the contactor is turned off by using a switch connected to this simple voltage detection circuit. As a result, when the voltage on the battery side equals to the voltage on the output side, it is determined that the contactor is melted to adhere.

CITATION LIST

Patent Literature

PTL 1: JP 2008-92656 A

SUMMARY OF INVENTION

Technical Problem

The power supply device disclosed in the above-mentioned PTL 1 can detect melting adhesion of the contactor, but cannot detect the adhesion when the contactor cannot conduct a current. Also, there is a time difference between the voltage detection timing on the battery side and on the output side, depending on the changeover time of the switch. Therefore, if voltage fluctuation occurs due to the charge or discharge of the battery, there is a possibility that it is determined that the state is normal even if the contactor is melted and adhered, because difference may occur between the detected voltages on the battery side and on the output side. Thus, conventional technology may not be able to detect the state of the contactor correctly.

Solution to Problem

A battery monitor according to the present invention includes: a voltage measuring circuit which measures voltages for detecting states of a positive side relay and a negative side relay connected between a positive terminal of a secondary battery and a load and between a negative terminal of the secondary battery and the load respectively; and an interface circuit group provided between the voltage measuring circuit and the positive side relay as well as the negative side relay, wherein the positive side relay makes or breaks continuity between a first positive contact point provided on a side toward the positive terminal of the secondary battery and a second positive contact point provided on a side toward the load, and the negative side relay makes or breaks continuity between a first negative contact point provided on a side toward the negative terminal of the secondary battery and a second negative contact point provided on a side toward the load, and wherein the voltage measuring circuit can measure a first voltage between the first positive contact point and the first negative contact point, a second voltage between the second positive contact point and the first negative contact point, and a third voltage between the first positive contact point and the second negative contact point, through the interface circuit group, detects the state of the positive side relay based on measurement results of the first voltage and the second voltage when the first voltage and the second voltage are measured in synchronization with each other, and detects the state of the negative side relay based on measurement results of the first voltage and the third voltage when the first voltage and the third voltage are measured in synchronization with each other.

Advantageous Effects of Invention

According to the present invention, the state of the relay provided on each of the positive terminal side and the negative terminal side of the secondary battery can be correctly detected.

DESCRIPTION OF EMBODIMENTS

First Embodiment

Figure 1:
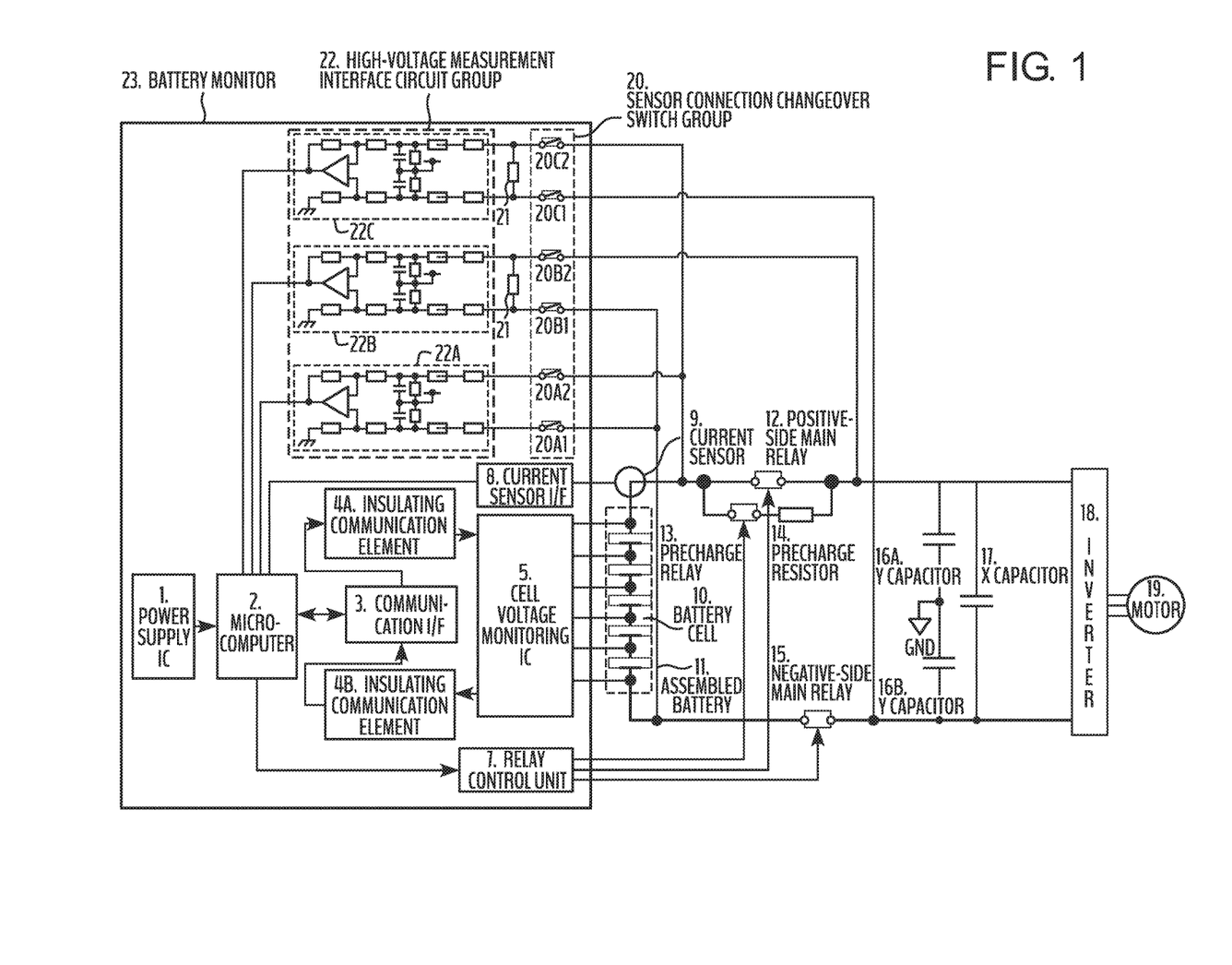
FIG. 1 is a diagram showing a configuration of a battery system including a battery monitor according to a first embodiment of the present invention.

FIG. 1 is a diagram showing a configuration of a battery system including a battery monitor according to a first embodiment of the present invention. In the battery system shown in FIG. 1, a battery monitor 23 is connected to an assembled battery 11, which is a secondary battery, and monitors the assembled battery 11 by measuring the voltage of each battery cell 10 constituting the assembled battery 11. The battery monitor 23 detects the state of each of a positive-side main relay 12 and a negative-side main relay 15 provided between the assembled battery 11 and an inverter 18, and monitors to determine whether these relays are operating normally.

The assembled battery 11 is connected to the inverter 18 through the positive-side main relay 12, a precharge relay 13, and the negative-side main relay 15. The positive-side main relay 12 has a contact point on each of the assembled battery 11 positive terminal side and the inverter 18 side and makes or breaks continuity between these contact points. The negative-side main relay 15 has a contact point on each of the assembled battery 11 negative terminal side and the inverter 18 side, and makes or breaks continuity between these contact points. The precharge relay 13 is provided with a contact point on each of the assembled battery 11 positive terminal side and the inverter 18 side in the same manner as the positive-side main relay 12 and makes or breaks continuity between these contact points. Incidentally, the precharge relay 13 is connected with a precharge resistor 14 in series.

The inverter 18 converts the DC power supplied from the assembled battery 11 to AC power and outputs the AC power to a motor 19 to drive the motor 19. At this time, the inverter 18 acts as a load of the assembled battery 11. The assembled battery 11 is connected to an X capacitor 17 in parallel with the inverter 18, and connected to Y capacitors 16A and 16B connected in series.

The battery monitor 23 includes a power supply IC 1, a microcomputer 2, a communication interface circuit 3, insulating communication elements 4A and 4B, a cell voltage monitoring IC 5, a relay control unit 7, a current sensor interface circuit 8, a sensor connection changeover switch group 20, and a high-voltage measurement interface circuit group 22. The power supply IC 1 supplies power to the microcomputer 2 to operate the microcomputer 2. The microcomputer 2 communicates with the cell voltage monitoring IC 5 via the communication interface circuit 3 and the insulating communication elements 4A and 4B so as to instruct the cell voltage monitoring IC 5 to measure the voltage of each battery cell 10 of the assembled battery 11, and obtains the measurement results from the cell voltage monitoring IC 5. In addition, the microcomputer 2 acquires the charge/discharge current of the assembled battery 11 measured by a current sensor 9 through the current sensor interface circuit 8. This charge/discharge current is preferably obtained in synchronization with the acquisition of the total voltage of the assembled battery 11. In addition, the microcomputer 2 detects the states of the positive-side main relay 12 and the negative-side main relay 15 by measuring the voltage through the high-voltage measurement interface circuit group 22 in order to conduct relay monitoring control to determine whether the states of these relays are normal. The details of this relay monitoring control will be described later.

The cell voltage monitoring IC 5 measures the voltage of each battery cell 10 of the assembled battery 11 according to the instruction of the microcomputer 2 and outputs the measurement result to the microcomputer 2. Based on the voltage measurement result of each battery cell 10 acquired from the cell voltage monitoring IC 5, the microcomputer 2 instructs the cell voltage monitoring IC 5 to perform cell balancing as needed to suppress voltage unevenness between the battery cells 10.

The relay control unit 7 switches the connecting states of the positive-side main relay 12, the negative-side main relay 15, and the precharge relay 13 according to the instruction of the microcomputer 2. When the energization of the inverter 18 from the assembled battery 11 is started, the microcomputer 2 instructs the relay control unit 7 to make the positive-side main relay 12 conductive after making the negative-side main relay 15 and the precharge relay 13 conductive and then to make the precharge relay 13 open. Thus, first the charging of the X capacitor 17 is started with the inrush current restricted by the precharge resistor 14, and then the power is supplied from the assembled battery 11 to the inverter 18 after the X capacitor 17 is fully charged. Also, when there is a risk of overcharging or overdischarging at least at one battery cell 10, the microcomputer 2 instructs the relay control unit 7 so that the positive-side main relay 12, the negative-side main relay 15, and the precharge relay 13 are all open. This protects the assembled battery 11 from overcharging and overdischarging.

The sensor connection changeover switch group 20 is composed of a plurality of switches for switching the connecting states between the high-voltage measurement interface circuit group 22 and both the contact points of the positive-side main relay 12 as well as both the contact points of the negative-side main relay 15, respectively. The sensor connection changeover switch group 20 has changeover switches 20A1, 20A2, 20B1, 20B2, 20C1 and 20C2. The changeover switch 20A1 is connected between a contact point provided on the assembled battery 11 negative terminal side of the negative-side main relay 15 (hereinafter, referred to as the first negative contact point) and the high-voltage measurement interface circuit group 22. The changeover switch 20A2 is connected between a contact point provided on the assembled battery 11 positive terminal side of the positive-side main relay 12 (hereinafter, referred to as a first positive contact point) and the high-voltage measurement interface circuit group 22. The changeover switch 20B1 is connected between the first negative contact point and the high-voltage measurement interface circuit group 22 in the same way as the changeover switch 20A1. The changeover switch 20B2 is connected between the contact point provided on the inverter 18 side of the positive-side main relay 12 (hereinafter, referred to as a second positive contact point) and the high-voltage measurement interface circuit group 22. The changeover switch 20C1 is connected between the contact point provided on the inverter 18 side of the negative-side main relay 15 (hereinafter, referred to as a second negative contact point) and the high-voltage measurement interface circuit group 22. The changeover switch 20C2 is connected between the first positive contact point and the high-voltage measurement interface circuit group 22, similarly to the changeover switch 20A2. The switching states of the changeover switches 20A1, 20A2, 20B1, 20B2, 20C1 and 20C2 are controlled by the microcomputer 2, respectively.

The high-voltage measurement interface circuit group 22 is provided between the microcomputer 2 and the positive-side main relay 12 as well as the negative-side main relay 15. The microcomputer 2 can measure the voltage between the first positive contact point and the first negative contact point (hereinafter, referred to as a first voltage), the voltage between the second positive contact point and the first negative contact point (hereinafter, referred to as a second voltage) and the voltage between the first positive contact point and the second negative contact point (hereinafter referred to as a third voltage) via the high-voltage measurement interface circuit group 22. In other words, the microcomputer 2 functions as a voltage measuring circuit for measuring the first voltage, second voltage, and third voltage by using the high-voltage measurement interface circuit group 22.

In the present embodiment, the high-voltage measurement interface circuit group 22 is composed of three interface circuits 22A, 22B and 22C. The interface circuit 22A outputs the first voltage to the microcomputer 2 via the changeover switches 20A1 and 20A2. The interface circuit 22C outputs the second voltage to the microcomputer 2 via the changeover switches 20B1 and 20B2. The interface circuit 22C outputs the third voltage to the microcomputer 2 via the changeover switches 20C1 and 20C2. The interface circuits 22A, 22B and 22C are each constituted by combining a resistor, a capacitor, and an operational amplifier, and converts the first, second, and third voltages into voltage levels suitable for measurement in the microcomputer 2. The interface circuits 22A, 22B, and 22C each have a high-resistance input impedance in order to ensure the insulation between the high voltage circuit connected to the assembled battery 11 and the low voltage circuit including the microcomputer 2.

When measuring the first voltage via the interface circuit 22A, the microcomputer 2 switches the changeover switches 20A1 and 20A2 to an ON state, and converts the first voltage output from the interface circuit 22A to a digital value and takes in the digital value. When measuring the second voltage via the interface circuit 22B, the microcomputer 2 switches the changeover switches 20B1 and 20B2 to an ON state, and converts the second voltage output from the interface circuit 22B to a digital value and takes in the digital value. When measuring the third voltage via the interface circuit 22C, the microcomputer 2 switches the changeover switches 20C1 and 20C2 to an ON state and converts the third voltage output from the interface circuit 220 to a digital value and takes in the digital value. The measurement result of the first voltage is used as the total voltage value of the assembled battery 11. By comparing this total voltage value and the total value of the voltages of the battery cells 10 acquired from the cell voltage monitoring IC 5, the consistency of the measurement result of the first voltage can be diagnosed.

Based on the measurement results of the first to third voltages obtained as described above, the microcomputer 2 performs relay monitoring control. To be specific, the measurement of the first voltage and the measurement of the second voltage are performed in synchronization with each other, and the results of these measurements are compared. As a result, when the first voltage and the second voltage coincide with each other, it is determined that the positive-side main relay 12 is in a conductive state, and when the voltages do not coincide, the positive-side main relay 12 is determined to be in the open (cutoff) state. Thereby, the microcomputer 2 can detect the state of the positive-side main relay 12. Also, the microcomputer 2 measures the first voltage and the third voltage in synchronization with each other, and compares these measurement results. As a result, when the first voltage and the third voltage coincide with each other, it is determined that the negative-side main relay 15 is in a conductive state, and when the voltages do not coincide, the negative-side main relay 15 is in an open (cutoff) state. In this way, the microcomputer 2 can detect the state of the negative-side main relay 15. Diagnosing whether the relays are operating normally based on the states of the positive-side main relays 12 and the negative-side main relays 15 thus detected, the microcomputer 2 can perform relay monitoring control. The time required for the microcomputer 2 to switch between the first to third voltages in the measurement is determined by the input channel switching time of the microcomputer 2, and is generally several microseconds. Therefore, by performing the measurement of the first voltage and the measurement of the second voltage or the third voltage in synchronization with each other as described above, the microcomputer 2 can perform these voltage measurements substantially at the same time with no time lag.

Bias resistors 21 are connected to the input sides of the interface circuits 22B and 22C, respectively. When the positive-side main relay 12 or the negative-side main relay 15 becomes in an open state, the charge stored in the X capacitor is discharged through the bias resistor 21. Thus, a significant potential difference can be generated between the first voltage and the second voltage or the third voltage. Accordingly, by measuring these voltages with the microcomputer 2, it can be reliably detected that the positive-side main relay 12 or the negative-side main relay 15 is in the open state.

Figure 4:
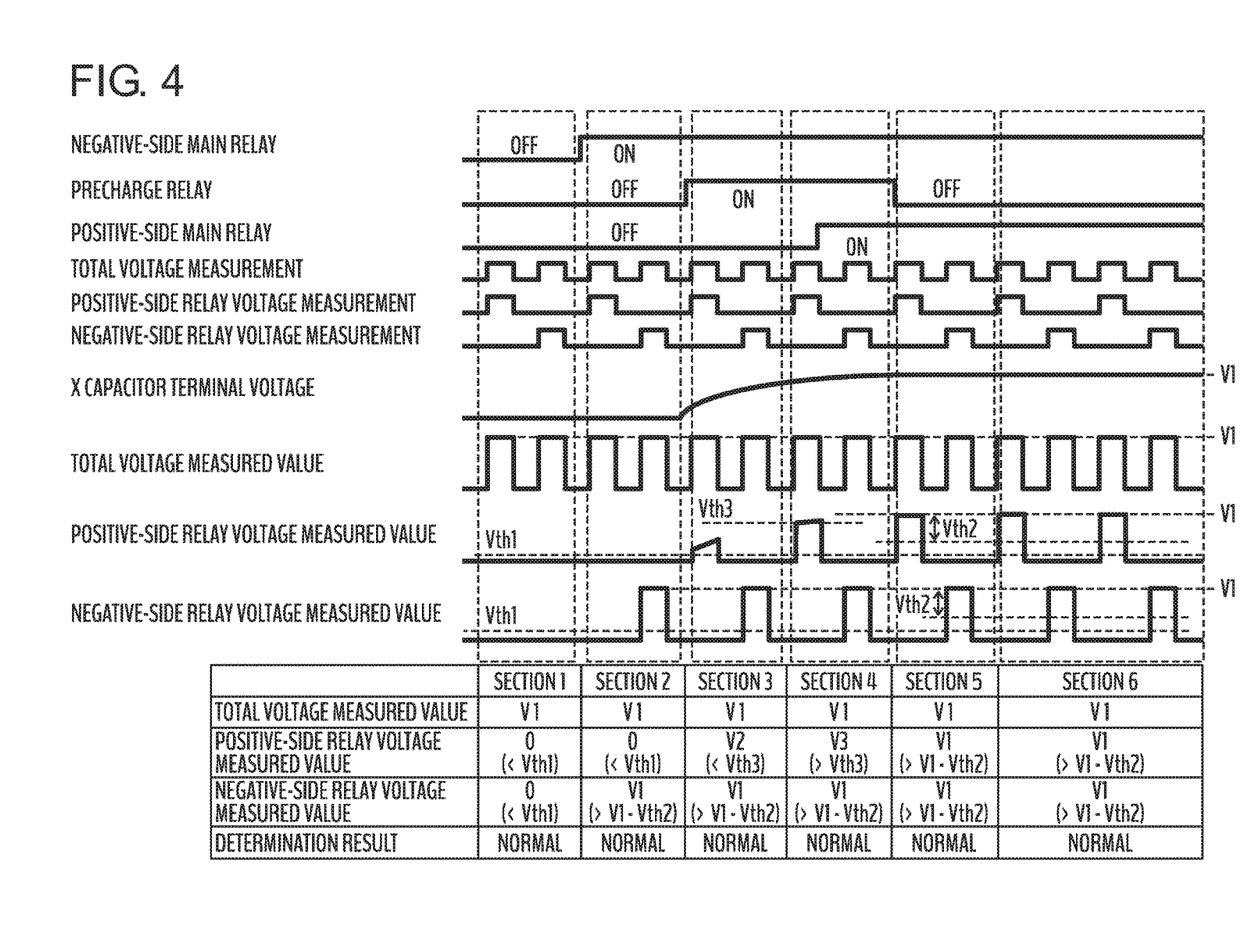
FIG. 4 is a diagram showing an example of a control sequence and operation expected values in a normal state according to the first embodiment of the present invention.

Next, the control sequence and operation expected values of the microcomputer 2 in relay monitoring control will be described with reference to FIGS. 4 and 5. FIG. 4 is a diagram showing an example of the control sequence and operation expected values in the normal operation according to the first embodiment of the present invention, and FIG. 5 is a diagram showing an example of the control sequence and operation expected values in the abnormal operation according to the first embodiment of the present invention.

Figure 5:
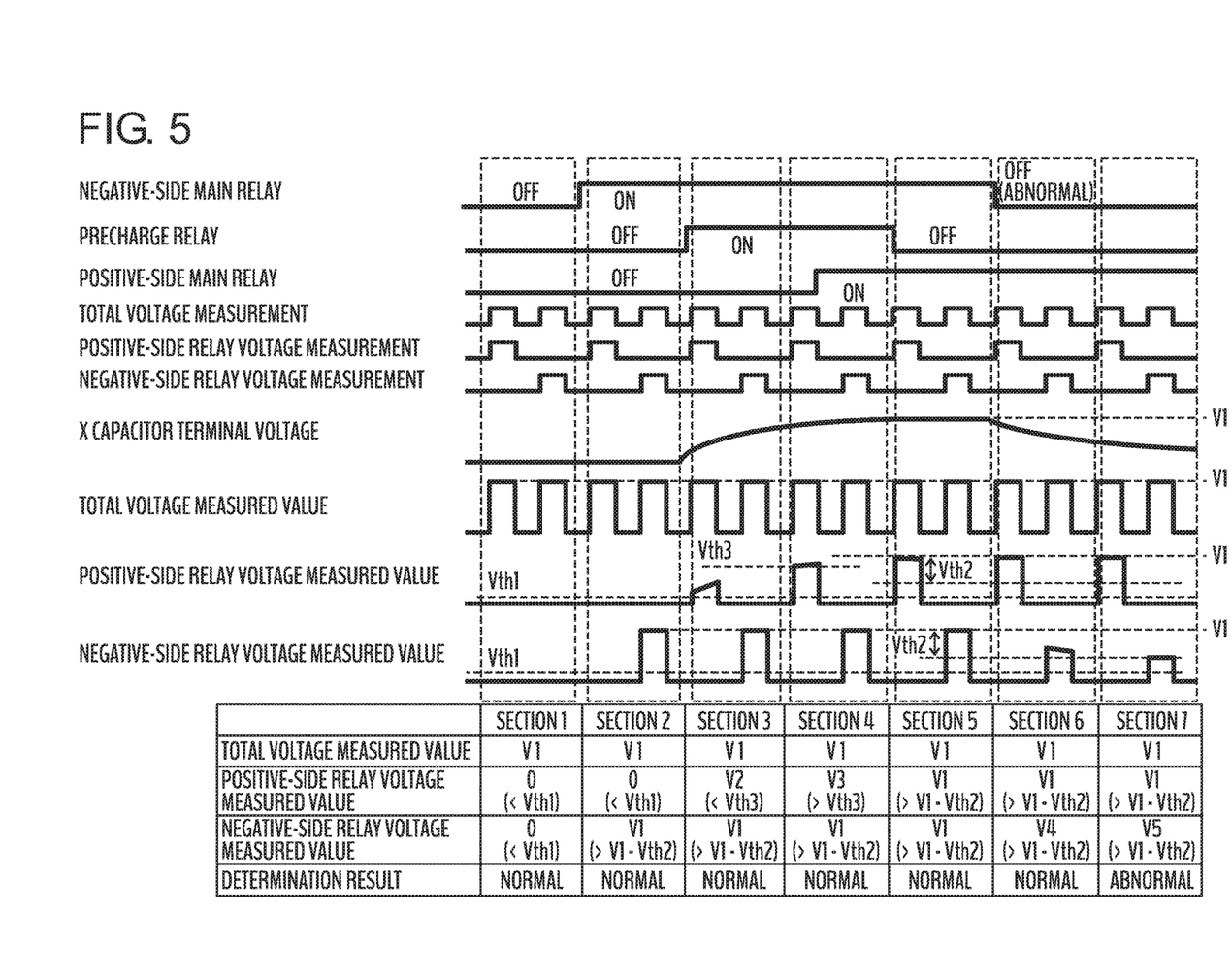
FIG. 5 is a diagram showing an example of the control sequence and the operation expected values in an abnormal state according to the first embodiment of the present invention.

In FIGS. 4 and 5, the upper part of the figure shows a timing chart and the lower part of the figure shows a determination table. The timing chart on the upper side illustrates the control timing of each relay and the measurement timing of the first to third voltages as an example of the control sequence of the microcomputer 2. The chart also illustrates the changes in the voltage between the terminals of the X capacitor 17 and each of the first to third voltages. On the other hand, the determination table on the lower side illustrates, as an example of the operation expected value of the microcomputer 2, the measured values of the first to third voltages and the result of the state determination of the positive-side main relay 12 and the negative-side main relay 15 obtained from these measured values. Each section of the timing chart shown by broken lines in the figure corresponds to sections 1 to 6 of the determination table in FIG. 4, and corresponds to sections 1 to 7 of the determination table in FIG. 5. In FIGS. 4 and 5, the "total voltage", "positive-side relay voltage" and "negative-side relay voltage" mean the first voltage, second voltage and third voltage, respectively.

As shown in FIGS. 4 and 5, the microcomputer 2 performs the measurement of the first voltage at predetermined intervals. In addition, the microcomputer 2 performs the measurement of the second voltage and the third voltage alternately at predetermined intervals in synchronization with the measurement of the first voltage.

In FIG. 4, section 1 is the section corresponding to the period when the high-order system (not illustrated), which is driven by the motor 19, is in a suspension state. In this section 1, the positive-side main relay 12, precharge relay 13, and negative-side main relay 15 are all open in the battery system shown in FIG. 1. The first voltage measured by the microcomputer 2 in section 1 is equal to the total voltage V1 of the assembled battery 11. On the other hand, since the X capacitor 17 is in a discharging state, both the second voltage (positive-side relay voltage) and the third voltage (negative-side relay voltage) are 0 V. That is, the measured values of these relay voltages are smaller than the predetermined threshold value Vth1. As a result, the microcomputer 2 detects that both the positive-side main relay 12 and the negative-side main relay 15 are open based on the difference between the measured values of these relay voltages and the measured value V1 of the first voltage, and can diagnose that the condition is normal.

In FIG. 4, sections 2 to 5 correspond to a series of periods until the high-order system is activated and the battery system in FIG. 1 starts operating. Section 2 corresponds to the period from when the negative-side main relay 15 is switched to a connected state until the precharge relay 13 is switched to the connected state. In this section 2, the positive-side main relay 12 and the precharge relay 13 remain open. Thus, in the same way as in section 1, the first voltage measured by the microcomputer 2 in section 2 is the total voltage V1 of the assembled battery 11, and the second voltage is 0 V. On the other hand, the negative-side main relay 15 has been switched from the open state to the connected state. Therefore, in section 2, the total voltage V1 of the assembled battery 11 is measured as the third voltage. Accordingly, since the first voltage and the third voltage coincide with each other, the microcomputer 2 detects that the negative-side main relay 15 is in the connected state and can diagnose that the state is normal.

Section 3 corresponds to the period from when the precharge relay 13 is switched to the connected state until the X capacitor 17 has been charged. In this section 3, charging of the X capacitor 17 is started because the precharge relay 13 and the negative-side main relay 15 become in the connected state. When the second voltage measured in section 3 is assumed to be V2, voltage between the terminals of the X capacitor 17 corresponding to the charged state is measured as the voltage V2, and in addition the total voltage V1 of the assembled battery 11 is measured as the third voltage. Hence, as in the case of section 2, since the first voltage and the third voltage coincide with each other, the microcomputer 2 detects that the negative-side main relay 15 is in the connected state and diagnoses that the state is normal. Assuming that the threshold value for the microcomputer 2 to determine that the precharge of the X capacitor 17 has been completed is Vth3, V2<Vth3 is satisfied in section 3. Thus, the precharge of the X capacitor 17 is continued.

Section 4 corresponds to the period from when the positive-side main relay 12 is switched to the connected state after the X capacitor 17 has been charged until the precharge relay 13 is switched to the open state. Assuming that the second voltage measured in section 4 is V3, the charging of the X capacitor 17 progresses and the voltage V3 rises to exceed the threshold value Vth3 described above, so that the microcomputer 2 determines that the precharge of the X capacitor 17 has been completed. Then, after switching the positive-side main relay 12 to the connected state, the microcomputer 2 switches the precharge relay 13 to the open state.

Section 5 corresponds to the period after the precharge relay 13 is switched to the open state. In this section 5, charging of the X capacitor 17 has been completed, and the voltage between the terminals of the X capacitor 17 is equal to the total voltage V1 of the assembled battery 11. In addition, the positive-side main relay 12 and the precharge relay 13 have been switched to the connected state. Therefore, in section 5, the total voltage V1 of the assembled battery 11 is measured as the second voltage and the third voltage, respectively. Since the first voltage, second voltage, and third voltage coincide with each other, the microcomputer 2 detects that the positive-side main relay 12 and the negative-side main relay 15 are in the connected state, and can diagnose that the state is normal.

In FIG. 4, section 6 corresponds to the period when both positive-side main relay and 12 and negative-side main relay 15 are in a normal state after section 5 has been passed. In this section 6, the total voltage V1 of the assembled battery 11 is measured as the second voltage and the third voltage, respectively, as in section 5. Since the first voltage, second voltage, and third voltage coincide with each other, the microcomputer 2 detects that the positive-side main relay 12 and the negative-side main relay 15 are in the connected state, and can diagnose that the state is normal. As a result, the microcomputer 2 can confirm that an abnormal open state of these relays without intention has not occurred.

In FIG. 5, a case is shown where the negative-side main relay 15 is switched to the open state accidentally in section 6 after the same operation as in FIG. 4 is performed in sections 1 to 5. In this case, while the total voltage V1 of the assembled battery 11 is measured as the second voltage, assuming that the third voltage measured in section 6 is V4, voltage between the terminals of the X capacitor 17 corresponding to the charging condition is measured as the voltage V4. When the negative-side main relay 15 is opened, the charge stored in the X capacitor 17 is discharged through the bias resistor 21 as described above so that the voltage between terminals of the X capacitor 17 gradually decreases. Here, it is assumed that when the threshold value for the microcomputer 2 to determine that the relay is open is Vth2 and the difference between the first voltage and the second voltage or the third voltage exceeds the threshold value Vth2, the microcomputer 2 determines that the positive-side main relay 12 or the negative-side main relay 15 is in the open state. Since there is still much charge left in the X capacitor 17, V4>V1−Vth2 is satisfied in section 6. Therefore, at this point, it is determined that the negative-side main relay 15 is in a normal state.

On the other hand, assuming that the third voltage measured in section 7 is V5, the discharge of the X capacitor 17 proceeds and the voltage between the terminals decreases to satisfy V5<V1−Vth2, and thus the microcomputer 2 detects that the negative-side main relay 15 is open. From the result of the state detection of the negative-side main relay 15, the microcomputer 2 can determine that abnormal switching to the open state of the negative-side main relay 15 has happened unintentionally.

With the relay monitoring control described above, the microcomputer 2 can monitor the states of the positive-side main relay 12 and the negative-side main relay 15 so as to detect the occurrence of abnormality.

According to the first embodiment of the present invention described above, the following operational effects are achieved.

(1) The battery monitor 23 has the microcomputer 2 measuring voltages to detect the states of the positive-side main relay 12 and the negative-side main relay 15 connected between the inverter 18 which is a load and the positive terminal of the assembled battery 11 which is a secondary battery as well as the negative terminal thereof respectively, and the high-voltage measurement interface circuit group 22 provided between the microcomputer 2 and the positive-side main relay 12 as well as the negative-side main relay 15. The positive-side main relay 12 makes or breaks continuity between the first positive contact point provided on the assembled battery 11 positive terminal side and the second positive contact point provided on the inverter 18 side. The negative-side main relay 15 makes or breaks continuity between the first negative contact point provided on the assembled battery 11 negative terminal side and the second negative contact point provided on the inverter 18 side. The microcomputer 2 can measure a first voltage between the first positive contact point and the first negative contact point, a second voltage between the second positive contact point and the first negative contact point, and the third voltage between the first positive contact point and the second negative contact point respectively through the high-voltage measurement interface circuit group 22. The microcomputer 2 detects the state of the positive-side main relay 12 based on the measurement results of the first voltage and the second voltage when the measurement of the first voltage and the measurement of the second voltage are performed in synchronization with each other. In addition, the microcomputer 2 detects the state of the negative-side main relay 15 based on the measurement results of the first voltage and the third voltage when the measurement of the first voltage and the measurement of the third voltage are performed in synchronization with each other. Thus, the states of the positive-side main relay 12 and the negative-side main relay 15 provided on the positive terminal side and the negative terminal side of the assembled battery 11 respectively can be correctly detected.

(2) The battery monitor 23 further has the sensor connection changeover switch group 20 for switching the connecting state between the high-voltage measurement interface circuit group 22 and at least one of the first positive contact point, second positive contact point, first negative contact point, and second negative contact point. To be specific, the sensor connection changeover switch group 20 includes the changeover switches 20A2 and 20C2 respectively connected between the first positive contact point and the high-voltage measurement interface circuit group 22, the changeover switch 20B2 connected between the second positive contact point and the high-voltage measurement interface circuit group 22, the changeover switches 20A1 and 20B1 respectively connected between the first negative contact point and the high-voltage measurement interface circuit group 22, and the changeover switch 20C1 connected between the second negative contact point and the high-voltage measurement interface circuit group 22. In addition, the high-voltage measurement interface circuit group 22 includes the interface circuit 22A for outputting the first voltage to the microcomputer 2 via the changeover switches 20A2 and 20A1, the interface circuit 22B for outputting the second voltage to the microcomputer 2 via the changeover switches 20B2 and 20B1, and the interface circuit 22C for outputting the third voltage to the microcomputer 2 via the changeover switches 20C2 and 20C1. In this way, the microcomputer 2 can safely and reliably measure the first voltage, second voltage, and third voltage.

Second Embodiment

Figure 2:
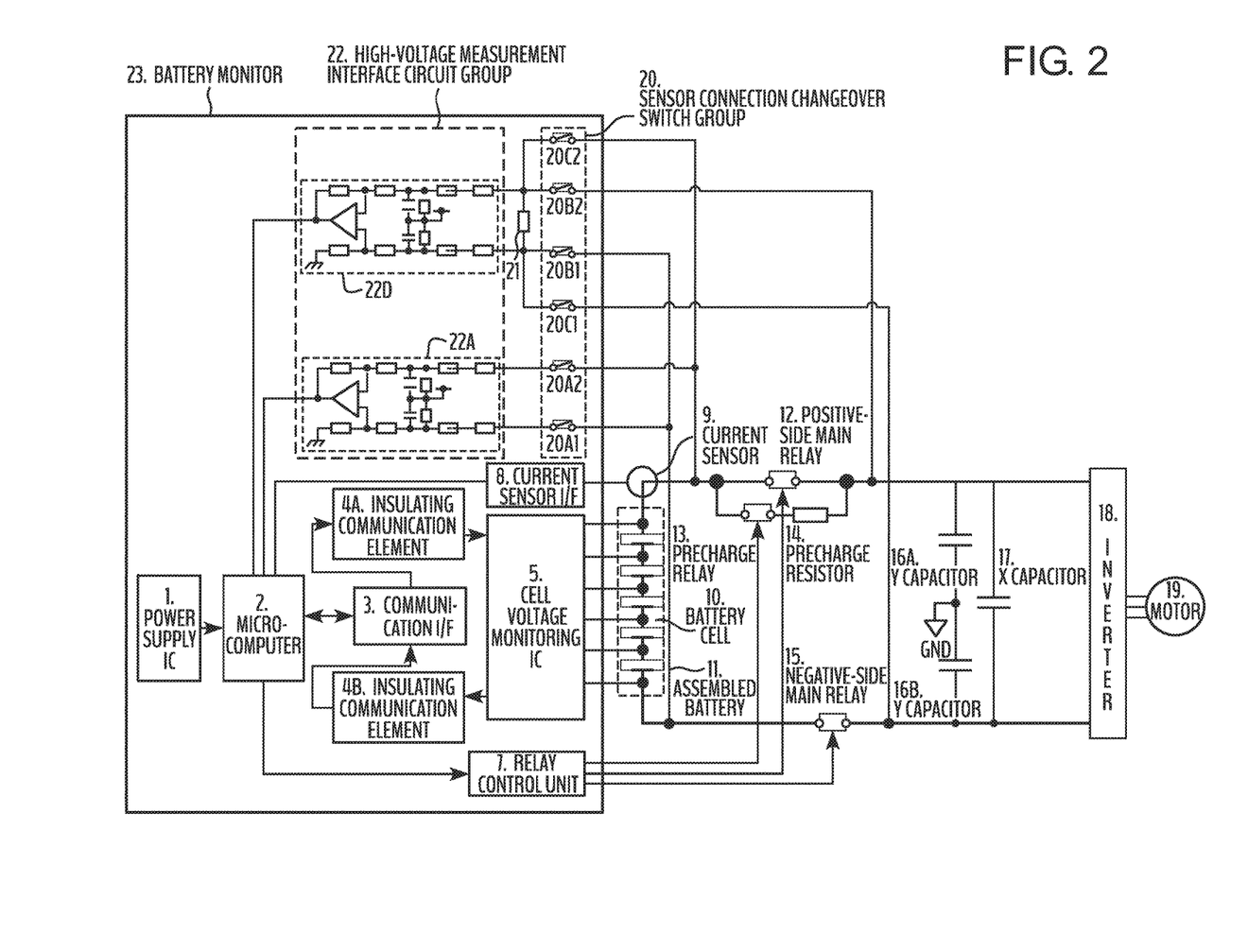
FIG. 2 is a diagram showing a configuration of a battery system including a battery monitor according to a second embodiment of the present invention.

FIG. 2 is a diagram showing a configuration of a battery system including a battery monitor according to a second embodiment of the present invention. The battery system shown in FIG. 2 differs from the battery system according to the first embodiment shown in FIG. 1 in that the high-voltage measurement interface circuit group 22 is composed of two interface circuits 22A and 22D.

In the present embodiment, the interface circuit 22D is used in place of the interface circuits 22B and 22C in FIG. 1. In other words, the interface circuit 22D outputs the second voltage to the microcomputer 2 via the changeover switches 20B1 and 20B2. In addition, the third voltage is output to the microcomputer 2 via the changeover switches 20C1 and 20C2. The microcomputer 2 can measure the second voltage and the third voltage via this interface circuit 22D. The bias resistor 21 is connected to the input side of the interface circuit 22D.

According to the second embodiment of the present invention described above, the same operational effects as in item (1) described in the first embodiment can be achieved, and the operational effect of the following item (3) can be achieved at the same time.

(3) The battery monitor 23 further includes the sensor connection changeover switch group 20 for switching the connecting state between the high-voltage measurement interface circuit group 22 and at least one of the first positive contact point, second positive contact point, first negative contact point, and second negative contact point. To be specific, the sensor connection changeover switch group 20 includes the changeover switches 20A2 and 20C2 respectively connected between the first positive contact point and the high-voltage measurement interface circuit group 22, the changeover switch 20B2 connected between the second positive contact point and the high-voltage measurement interface circuit group 22, the changeover switches 20A1 and 20B1 respectively connected between the first negative contact point and the high-voltage measurement interface circuit group 22, and the changeover switch 20C1 connected between the second negative contact point and the high-voltage measurement interface circuit group 22. In addition, the high-voltage measurement interface circuit group 22 includes the interface circuit 22A for outputting the first voltage to the microcomputer 2 via the changeover switches 20A2 and 20A1, and the interface circuit 22D for outputting the second voltage to the microcomputer 2 via the changeover switches 20B2 and 20B1, and in addition, outputting the third voltage to the microcomputer 2 via the changeover switches 20C2 and 20C1. Due to this, the microcomputer 2 can safely and reliably measure the first voltage, second voltage, and third voltage. Furthermore, the circuit scale of the high-voltage measurement interface circuit group 22 can be reduced and the number of components can be reduced compared to the first embodiment.

Third Embodiment

Figure 3:
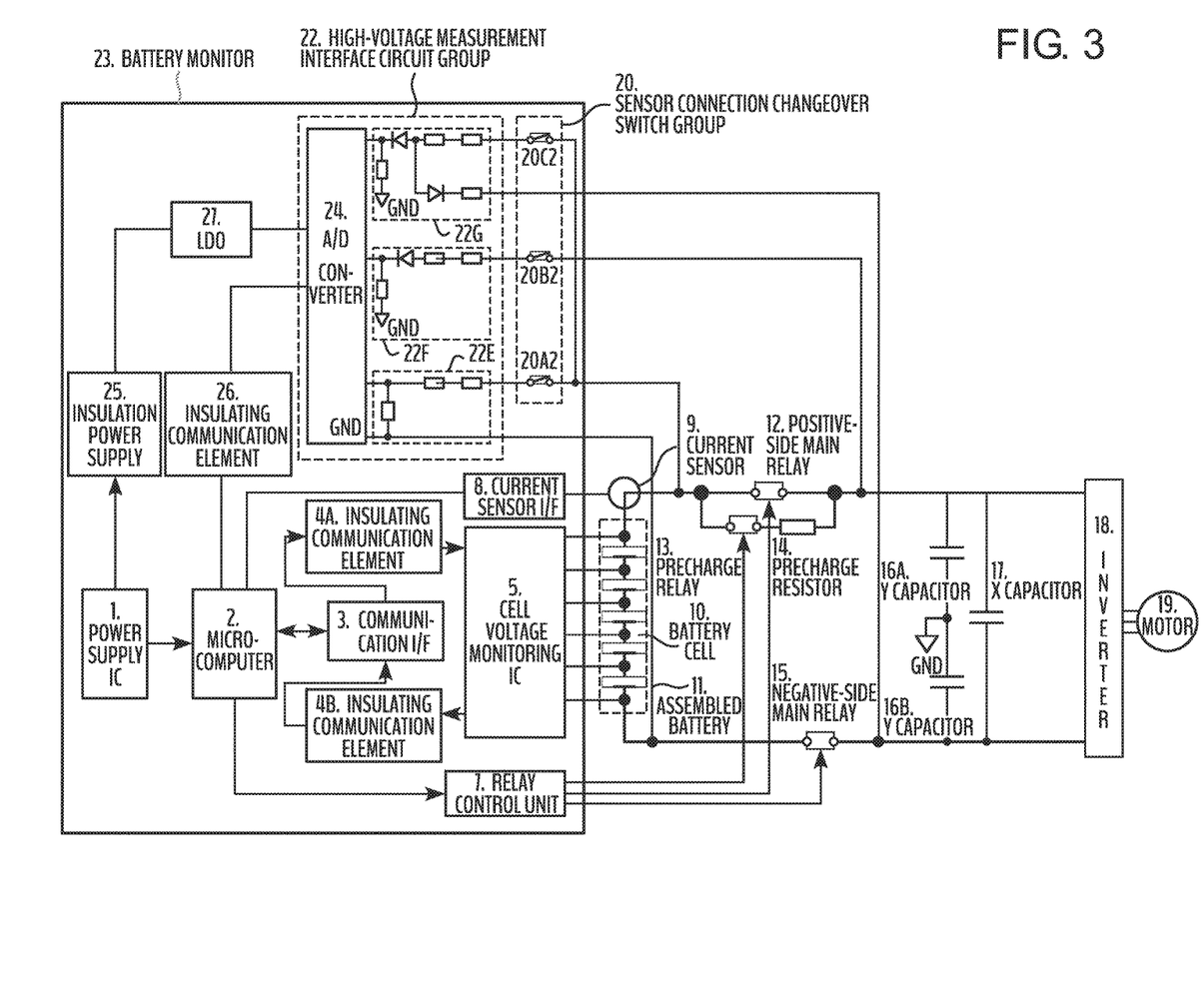
FIG. 3 is a diagram showing a configuration of a battery system including a battery monitor according to a third embodiment of the present invention.

FIG. 3 is a diagram showing a configuration of a battery system including a battery monitor according to a third embodiment of the present invention. The battery system shown in FIG. 3 differs from the battery system according to the first embodiment shown in FIG. 1 in that the high-voltage measurement interface circuit group 22 is composed of an A/D converter 24 and three interface circuits 22E, 22F and 22G and that the sensor connection changeover switch group 20 is composed of only the three changeover switches 20A2, 20B2 and 20C2. In addition, the battery monitor 23 further includes an insulation power supply 25, an insulating communication element 26, and a low dropout linear regulator (LDO) 27, which is different from the battery system according to the first embodiment.

The interface circuit 22E converts the first voltage input via the changeover switch 20A2 into a voltage within the input voltage range of the A/D converter 24 and outputs the voltage to the A/D converter 24. The interface circuit 22F converts the second voltage input via the changeover switch 20B2 into a voltage within the input voltage range of the A/D converter 24 and outputs the voltage to the A/D converter 24. The interface circuit 22G converts the third voltage input via the changeover switch 20C2 into a voltage within the input voltage range of the A/D converter 24 and outputs the voltage to the A/D converter 24. The A/D converter 24 converts the first to third voltages that have been input to digital values respectively and outputs the values to the microcomputer 2 via the insulating communication element 26. The microcomputer 2 can measure the first to third voltages by acquiring the digital values of the first to third voltages from the A/D converter 24, respectively.

The insulation power supply 25 supplies power, which is insulated from the power supply IC 1 to the LDO 27, based on the power supplied from the power supply IC 1. The LDO 27 generates the operating power for the A/D converter 24 and supplies the power to the A/D converter 24 based on the power supplied from the insulation power supply 25.

In the battery system of FIG. 3, the insulation between the high-voltage measurement interface circuit group 22 and the power supply IC 1 as well as the microcomputer 2 is ensured by the insulation power supply 25 and the insulating communication element 26. This ensures the insulation between the high-voltage circuit connected to the assembled battery 11 and the low-voltage circuit including the microcomputer 2, even if the input impedance of the high-voltage measurement interface circuit group 22 is low. Accordingly, the changeover switches 20A1, 20B1 and 20C1 on the negative side shown in FIGS. 1 and 2 can be omitted by configuring the sensor connection changeover switch group 20 by using only the positive side changeover switches 20A2, 20B2 and 20C2. In addition, the resistance of the interface circuits 22E, 22F and 22G can be used as a bias resistor, and the bias resistor 21 shown in FIGS. 1 and 2 can be omitted.

As shown in FIG. 3, in the battery system of the present embodiment, the branching from the first positive contact point to the changeover switches 20A2 and 20C2 may be made inside the battery monitor 23. Thus, the structure can be simplified by reducing the number of connection lines and connector terminals of the battery monitor 23.

Figure 6:
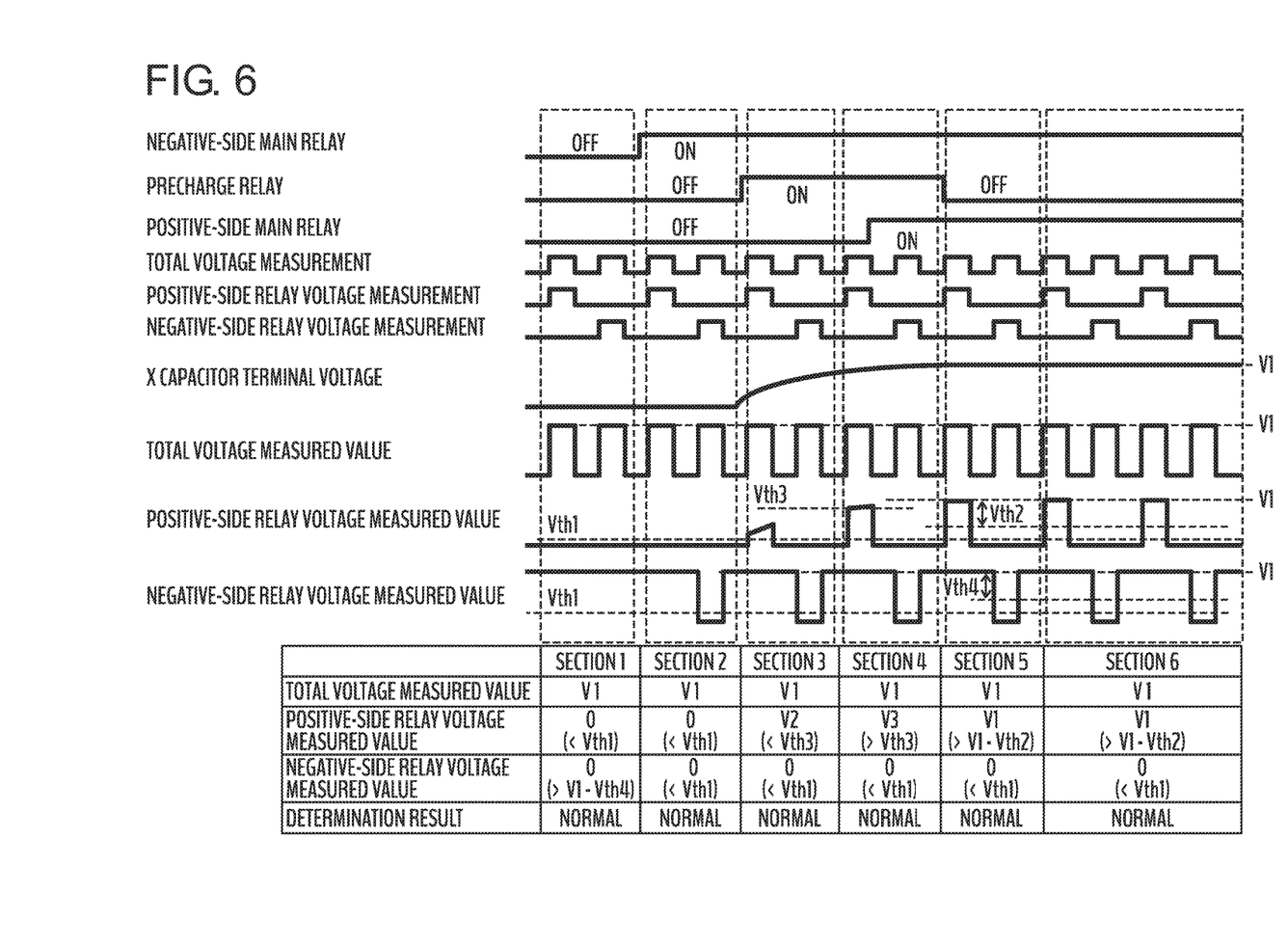
FIG. 6 is a diagram showing an example of a control sequence and operation expected values in a normal state according to the third embodiment of the present invention.

In the battery system according to the present embodiment, the positive and negative polarities of the third voltage are reversed as compared with the battery systems according to the first and second embodiments shown in FIGS. 1 and 2, respectively. This point will be described below with reference to FIGS. 6 and 7. FIG. 6 is a diagram showing an example of the control sequence and the operation expected values in a normal state according to the third embodiment of the present invention and FIG. 7 is a diagram showing an example of the control sequence and operation expected values in the abnormal state according to the third embodiment of the present invention.

Figure 7:
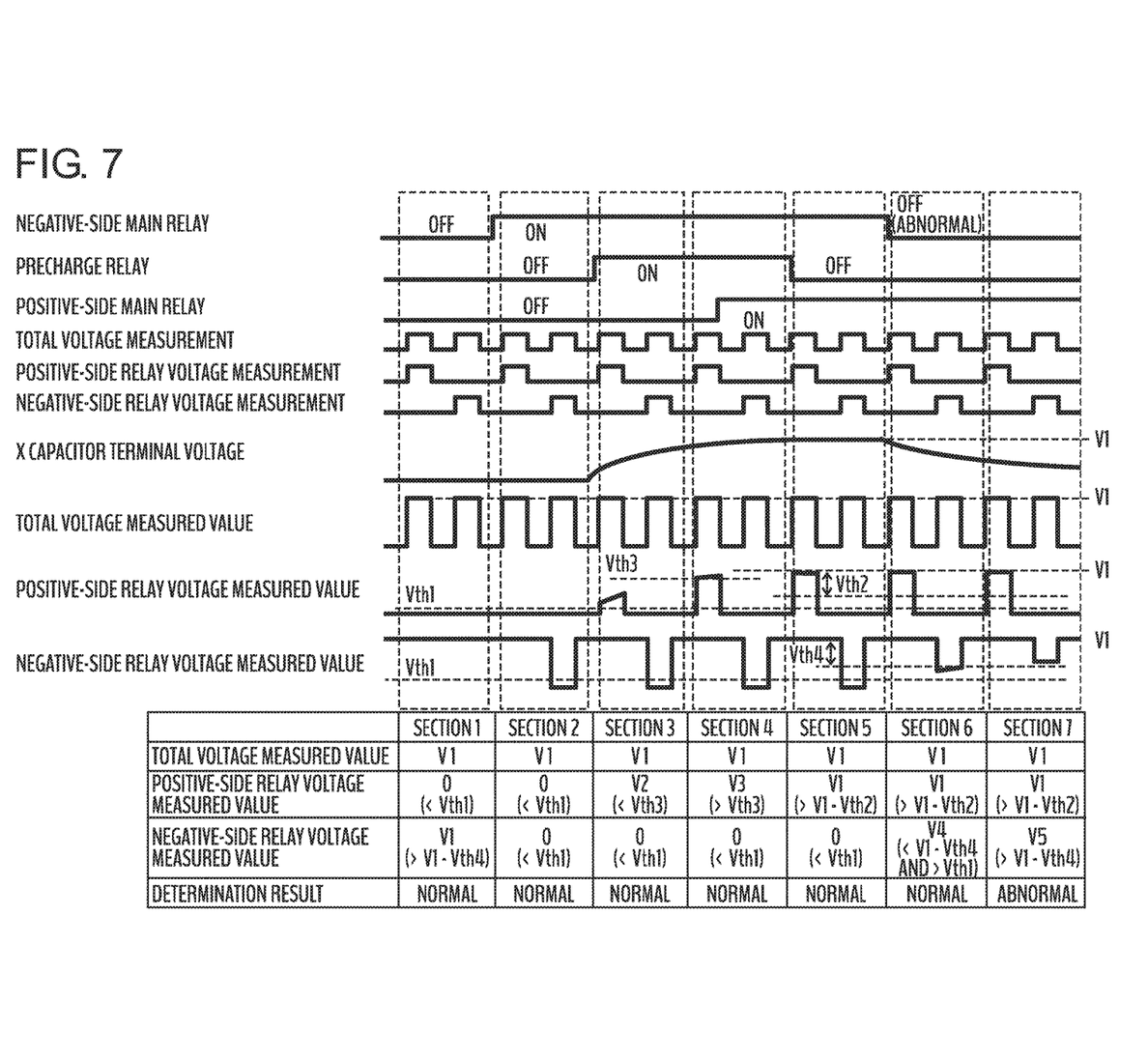
FIG. 7 is a diagram showing an example of the control sequence and the operation expected values in an abnormal state according to the third embodiment of the present invention.

Similarly to FIGS. 4 and 5, a timing chart is shown on the upper part of the figure and a determination table is shown on the lower part of the figure in FIGS. 6 and 7. In the timing chart on the upper side, the parts other than the change in the third voltage shown at the lowermost column in FIGS. 6 and 7 are the same as those in FIGS. 4 and 5 respectively. In the determination table on the lower side, the parts other than the measured values of the third voltage are the same as those in FIGS. 4 and 5.

In FIGS. 6 and 7, since the X capacitor 17 is in the discharging state in section 1, the third voltage (negative-side relay voltage) measured by the microcomputer 2 is equal to the total voltage V1 of the assembled battery 11. Here, is assumed that the threshold value for the microcomputer 2 to determine that the negative-side main relay 15 is open is Vth4 and when the difference between the first voltage and the third voltage is less than the threshold value Vth4, microcomputer 2 determines that the negative-side main relay 15 is in the open state. Since both the first voltage and the third voltage are equally V1 in section 1, it is possible to detect that the negative-side main relay 15 is in the open state and to diagnose that the state is normal.

In section 2, since the negative-side main relay 15 has been switched from the open state to the connected state, the measured value of the third voltage is 0 V, which is smaller than the above-mentioned threshold value Vth1. That is, the difference between the first voltage and the third voltage is smaller than the above-mentioned threshold value Vth4. Accordingly, the microcomputer 2 detects that the negative-side main relay 15 is in the connected state and can diagnose that the state is normal.

In the case of FIG. 6, since the negative-side main relay 15 remains in the connected state in section 2 and thereafter, the same operation and determination as in section 2 are performed even in sections 3 to 6 by the microcomputer 2. On the other hand, in the case of FIG. 7, the negative-side main relay 15 is switched to the open state without intention in section 6. Hence, the third voltage V4 measured in the section 6 is equal to the voltage obtained by subtracting the voltage between terminals of the X capacitor 17 corresponding to the charging state from the total voltage V1 of the assembled battery 11. When the negative-side main relay 15 is opened, the charge stored in the X capacitor 17 is discharged through the interface circuit 22G, so that the voltage between terminals of the X capacitor 17 gradually decreases. Since much charge remains in the X capacitor 17 in section 6, V4<V1−Vth4 is satisfied even though V4>Vth1 is admitted. Therefore, at this point, it is determined that the negative-side main relay 15 is in a normal state.

Thereafter, the third voltage increases and the third voltage V5 measured in section 7 satisfies V5>V1−Vth4 because the discharge of the X capacitor 17 progresses and the voltage between the terminals decreases. Thus, the microcomputer 2 detects that the negative-side main relay 15 is in the open state. From the result of the state detection of the negative-side main relay 15, the microcomputer 2 can determine that the negative-side main relay 15 has been switched to an unintended abnormal open state.

According to the third embodiment of the present invention described above, the same operational effects as in item (1) described in the first embodiment can be achieved, and at the same time, the operational effect of the following item (4) can be achieved.

(4) The battery monitor 23 further has the sensor connection changeover switch group 20 for switching the connecting state between the high-voltage measurement interface circuit group 22 and at least one of the first positive contact point, second positive contact point, first negative contact point, and second negative contact point. To be specific, the sensor connection changeover switch group 20 includes the changeover switches 20A2 and 20C2 respectively connected between the first positive contact point and the high-voltage measurement interface circuit group 22, and the changeover switch 20B2 connected between the second positive contact point and the high-voltage measurement interface circuit group 22. Further, the high-voltage measurement interface circuit group 22 includes the A/D converter 24, the interface circuit 22E for outputting the first voltage to the A/D converter 24 via the changeover switch 20A2, the interface circuit 22F for outputting the second voltage to the A/D converter 24 via the changeover switch 20B2, and the interface circuit 22G for outputting the third voltage to the A/D converter 24 via the changeover switch 20C2. The A/D converter 24 converts the first voltage, second voltage, and third voltage to digital values and outputs the values to the microcomputer 2. Due to this, the microcomputer 2 can safely and reliably measure the first voltage, second voltage, and third voltage. Moreover, compared with the first embodiment, the number of changeover switches constituting the sensor connection changeover switch group 20 can be reduced, and at the same time, the bias resistor 21 can be omitted to reduce the number of components.

The embodiments and variations described above are merely examples, and the present invention is not limited to these contents as long as the features of the invention are not impaired.

REFERENCE SIGNS LIST

1: power supply IC
2: microcomputer
3: communication interface circuit
4A, 4B: insulating communication element
5: cell voltage monitoring IC
7: relay control unit
8: current sensor interface circuit
9: current sensor
10: battery cell
11: assembled battery
12: positive-side main relay
13: precharge relay
14: precharge resistor
15: negative-side main relay
16A, 16B: Y capacitor
17: X capacitor
18: inverter
19: motor
20: sensor connection changeover switch group
21: bias resistor
22: high-voltage measurement interface circuit group
23: battery monitor
24: A/D converter
25: insulation power supply
26: insulating communication element
27: LDO

The invention claimed is:

1. A battery monitor comprising:
a voltage measuring circuit which measures voltages for detecting states of a positive side relay and a negative side relay connected between a positive terminal of a secondary battery and a load and between a negative terminal of the secondary battery and the load respectively;
an interface circuit group provided between the voltage measuring circuit and the positive side relay as well as the negative side relay; and
a changeover switch group for switching a connecting state between the interface circuit group and at least one of the first positive contact point, the second positive contact point, the first negative contact point and the second negative contact point,
wherein the positive side relay makes or breaks continuity between a first positive contact point provided on a side toward the positive terminal of the secondary battery and a second positive contact point provided on a side toward the load, and
the negative side relay makes or breaks continuity between a first negative contact point provided on a side toward the negative terminal of the secondary battery and a second negative contact point provided on a side toward the load, and
wherein the voltage measuring circuit can measure a first voltage between the first positive contact point and the first negative contact point, a second voltage between the second positive contact point and the first negative contact point, and a third voltage between the first positive contact point and the second negative contact point, through the interface circuit group,
detects the state of the positive side relay based on measurement results of the first voltage and the second voltage when the first voltage and the second voltage are measured in synchronization with each other,
detects the state of the negative side relay based on measurement results of the first voltage and the third voltage when the first voltage and the third voltage are measured in synchronization with each other,
wherein the changeover switch group includes:
a first changeover switch and a second changeover switch respectively connected between the first positive contact point and the interface circuit group;
a third changeover switch connected between the second positive contact point and the interface circuit group;
a fourth changeover switch and a fifth changeover switch respectively connected between the first negative contact point and the interface circuit group; and
a sixth changeover switch connected between the second negative contact point and the interface circuit group, and
wherein the interface circuit group includes:
a first interface circuit for outputting the first voltage to the voltage measuring circuit through the first changeover switch and the fourth changeover switch;
a second interface circuit for outputting the second voltage to the voltage measuring circuit through the third changeover switch and the fifth changeover switch; and
a third interface circuit for outputting the third voltage to the voltage measuring circuit through the second changeover switch and the sixth changeover switch.

2. A battery monitor comprising:
a voltage measuring circuit which measures voltages for detecting states of a positive side relay and a negative side relay connected between a positive terminal of a secondary battery and a load and between a negative terminal of the secondary battery and the load respectively;
an interface circuit group provided between the voltage measuring circuit and the positive side relay as well as the negative side relay; and
a changeover switch group for switching a connecting state between the interface circuit group and at least one of the first positive contact point, the second positive contact point, the first negative contact point and the second negative contact point,
wherein the positive side relay makes or breaks continuity between a first positive contact point provided on a side toward the positive terminal of the secondary battery and a second positive contact point provided on a side toward the load, and
the negative side relay makes or breaks continuity between a first negative contact point provided on a side toward the negative terminal of the secondary battery and a second negative contact point provided on a side toward the load, and
wherein the voltage measuring circuit can measure a first voltage between the first positive contact point and the first negative contact point, a second voltage between the second positive contact point and the first negative contact point, and a third voltage between the first positive contact point and the second negative contact point, through the interface circuit group, detects the state of the positive side relay based on measurement results of the first voltage and the second voltage when the first voltage and the second voltage are measured in synchronization with each other, detects the state of the negative side relay based on measurement results of the first voltage and the third voltage when the first voltage and the third voltage are measured in synchronization with each other, wherein the changeover switch group includes:
- a first changeover switch and a second changeover switch respectively connected between the first positive contact point and the interface circuit group;
- a third changeover switch connected between the second positive contact point and the interface circuit group;
- a fourth changeover switch and a fifth changeover switch respectively connected between the first negative contact point and the interface circuit group; and
- a sixth changeover switch connected between the second negative contact point and the interface circuit group, and wherein the interface circuit group includes:
- a first interface circuit for outputting the first voltage to the voltage measuring circuit through the first changeover switch and the fourth changeover switch; and
- a fourth interface circuit for outputting the second voltage to the voltage measuring circuit through the third changeover switch and the fifth changeover switch, as well as outputting the third voltage to the voltage measuring circuit through the second changeover switch and the sixth changeover switch.

3. A battery monitor comprising:
- a voltage measuring circuit which measures voltages for detecting states of a positive side relay and a negative side relay connected between a positive terminal of a secondary battery and a load and between a negative terminal of the secondary battery and the load respectively;
- an interface circuit group provided between the voltage measuring circuit and the positive side relay as well as the negative side relay; and
- a changeover switch group for switching a connecting state between the interface circuit group and at least one of the first positive contact point, the second positive contact point, the first negative contact point and the second negative contact point, wherein the positive side relay makes or breaks continuity between a first positive contact point provided on a side toward the positive terminal of the secondary battery and a second positive contact point provided on a side toward the load, and the negative side relay makes or breaks continuity between a first negative contact point provided on a side toward the negative terminal of the secondary battery and a second negative contact point provided on a side toward the load, and wherein the voltage measuring circuit can measure a first voltage between the first positive contact point and the first negative contact point, a second voltage between the second positive contact point and the first negative contact point, and a third voltage between the first positive contact point and the second negative contact point, through the interface circuit group, detects the state of the positive side relay based on measurement results of the first voltage and the second voltage when the first voltage and the second voltage are measured in synchronization with each other, detects the state of the negative side relay based on measurement results of the first voltage and the third voltage when the first voltage and the third voltage are measured in synchronization with each other, wherein the changeover switch group includes:
- a first changeover switch and a second changeover switch respectively connected between the first positive contact point and the interface circuit group; and
- a third changeover switch connected between the second positive contact point and the interface circuit group, wherein the interface circuit group includes:
- an A/D converter;
- a fifth interface circuit for outputting the first voltage to the A/D converter through the first changeover switch;
- a sixth interface circuit for outputting the second voltage to the A/D converter through the third changeover switch; and
- a seventh interface circuit for outputting the third voltage to the A/D converter through the second changeover switch, wherein the A/D converter converts the first voltage, the second voltage, and the third voltage into digital values and outputs the values to the voltage measuring circuit.

* * * * *